(12) United States Patent
Tan et al.

(10) Patent No.: US 9,530,354 B2
(45) Date of Patent: Dec. 27, 2016

(54) ACTIVE MATRIX ORGANIC LIGHT EMITTING DIODE PIXEL UNIT CIRCUIT AND DISPLAY PANEL

(71) Applicants: CHENGDU BOE OPTOELECTRONICS TECHNOLOGY CO., LTD., Chengdu, Sichuan Province (CN); BOE TECHNOLOGY GROUP CO., LTD., Beijing (CN)

(72) Inventors: Wen Tan, Beijing (CN); Xiaojing Qi, Beijing (CN); Bo Wu, Beijing (CN)

(73) Assignees: CHENGDU BOE OPTOELECTRONICS TECHNOLOGY CO., LTD. (CN); BOE TECHNOLOGY GROUP CO., LTD. (CN)

( * ) Notice: Subject to any disclaimer, the term of this patent is extended or adjusted under 35 U.S.C. 154(b) by 202 days.

(21) Appl. No.: 14/235,319

(22) PCT Filed: Oct. 9, 2013

(86) PCT No.: PCT/CN2013/084919
§ 371 (c)(1),
(2) Date: Jan. 27, 2014

(87) PCT Pub. No.: WO2014/205950
PCT Pub. Date: Dec. 31, 2014

(65) Prior Publication Data
US 2015/0302801 A1      Oct. 22, 2015

(30) Foreign Application Priority Data

Jun. 26, 2013   (CN) .......................... 2013 1 0259706

(51) Int. Cl.
*G09G 3/3258*   (2016.01)
*G09G 3/32*     (2016.01)
(Continued)

(52) U.S. Cl.
CPC ............ *G09G 3/3258* (2013.01); *G06F 3/042* (2013.01); *G06F 3/0412* (2013.01);
(Continued)

(58) Field of Classification Search
CPC ............... G09G 3/3258; G09G 3/3233; G09G 2310/0291; G09G 2320/0219; G09G 2300/043; G09G 2300/0426; G09G 2300/0819; G09G 2300/0861; G09G 2310/0262; G09G 2320/0233; G09G 2320/043; G09G 3/3275; G09G 2320/0626; G09G 2310/0251; G06F 3/0412; G06F 3/0416; G06F 3/042; H01L 27/3248
See application file for complete search history.

(56) References Cited

U.S. PATENT DOCUMENTS

| 2005/0007353 A1* | 1/2005 | Smith | G09G 3/3233 345/204 |
| 2005/0093791 A1* | 5/2005 | Lo | G09G 3/3233 345/82 |

(Continued)

FOREIGN PATENT DOCUMENTS

| CN | 1669067 A | 9/2005 |
| CN | 101576676 A | 11/2009 |

(Continued)

OTHER PUBLICATIONS

International Search Report and Written Opinion for PCT/CN2013/084919, English translation attached to original, Both completed by the Chinese Patent Office on Apr. 3, 2014, 23 pages.

(Continued)

*Primary Examiner* — Liliana Cerullo (74) *Attorney, Agent, or Firm* — Brooks Kushman P.C.

(57) ABSTRACT

The present invention provides an active matrix organic light emitting diode, AMOLED pixel unit circuit and a display panel for integrating a touch screen circuit into the AMOLED pixel unit circuit, and manufacturing an AMOLED display panel having the functionality of a touch screen. The AMOLED pixel unit circuit comprises a driving module, configured to amplify a induction signal generated by a touch sensing module, output the induction signal through a induction signal output module, and drive a light emitting module; the light emitting control module, configured to control the light emitting module to emit light; a threshold compensation module, configured to compensate a threshold voltage of the driving module; a charging module, configured to charge the threshold compensation module; the touch sensing module, configured to generate the induction signal and output the induction signal to the driving module; and the induction signal output module, configured to output the induction signal amplified by the driving module.

14 Claims, 5 Drawing Sheets

(51) Int. Cl.
*G06F 3/042* (2006.01)
*G06F 3/041* (2006.01)
*H01L 27/32* (2006.01)

(52) U.S. Cl.
CPC ......... *G06F 3/0416* (2013.01); *G09G 3/3233* (2013.01); *H01L 27/323* (2013.01); *H01L 27/3248* (2013.01); *G09G 2300/043* (2013.01); *G09G 2300/0426* (2013.01); *G09G 2300/0819* (2013.01); *G09G 2300/0861* (2013.01); *G09G 2310/0262* (2013.01); *G09G 2310/0291* (2013.01); *G09G 2320/0219* (2013.01); *G09G 2320/0233* (2013.01); *G09G 2320/043* (2013.01)

(56) References Cited

U.S. PATENT DOCUMENTS

| | | | |
|---|---|---|---|
| 2006/0164344 A1 | 7/2006 | Fish | |
| 2006/0214893 A1* | 9/2006 | Tseng | G06F 3/0412 345/82 |
| 2006/0267508 A1* | 11/2006 | Sun | G09G 3/3233 315/169.3 |
| 2009/0153438 A1* | 6/2009 | Miller | G06F 3/0488 345/55 |
| 2009/0225011 A1 | 9/2009 | Choi | |
| 2009/0231308 A1* | 9/2009 | Numao | G09G 3/3233 345/204 |
| 2010/0012823 A1* | 1/2010 | Ahn | G06F 3/042 250/214 R |
| 2010/0039406 A1* | 2/2010 | Lee | G02F 1/13338 345/174 |
| 2010/0097350 A1 | 4/2010 | Choi et al. | |
| 2010/0097354 A1* | 4/2010 | Ahn | G06F 3/042 345/175 |
| 2010/0144391 A1 | 6/2010 | Chang et al. | |
| 2010/0220069 A1* | 9/2010 | Choi | G01J 1/02 345/173 |
| 2011/0001711 A1* | 1/2011 | Choi | G06F 3/0412 345/173 |
| 2011/0115764 A1 | 5/2011 | Chung | |
| 2012/0038585 A1 | 2/2012 | Kim | |
| 2012/0044176 A1 | 2/2012 | Nakamura et al. | |
| 2012/0061556 A1* | 3/2012 | Chan | G09G 3/3233 250/214 R |
| 2012/0154319 A1 | 6/2012 | Konicek | |
| 2013/0063407 A1 | 3/2013 | Usukura et al. | |
| 2013/0088165 A1 | 4/2013 | Wang et al. | |
| 2013/0106828 A1 | 5/2013 | Kim | |
| 2013/0127787 A1 | 5/2013 | Kim et al. | |
| 2013/0146881 A1 | 6/2013 | Yamazaki et al. | |
| 2014/0055326 A1 | 2/2014 | Lai | |
| 2014/0118231 A1 | 5/2014 | Yang et al. | |
| 2014/0168127 A1 | 6/2014 | Yang | |

FOREIGN PATENT DOCUMENTS

| | | |
|---|---|---|
| CN | 101587256 A | 11/2009 |
| CN | 101587400 A | 11/2009 |
| CN | 101630481 A | 1/2010 |
| CN | 101726890 A | 6/2010 |
| CN | 101943974 A | 1/2011 |
| CN | 101944323 A | 1/2011 |
| CN | 102117596 A | 7/2011 |
| CN | 102402931 A | 4/2012 |
| CN | 102903333 A | 1/2013 |
| CN | 103135846 A | 6/2013 |
| CN | 103295525 A | 9/2013 |
| CN | 103325343 A | 9/2013 |
| CN | 103354078 A | 10/2013 |
| CN | 103354079 A | 10/2013 |
| CN | 103354080 A | 10/2013 |
| CN | 203242305 U | 10/2013 |
| CN | 203300191 U | 11/2013 |
| CN | 203300192 U | 11/2013 |
| CN | 203300193 U | 11/2013 |
| CN | 203300194 U | 11/2013 |
| JP | 2010085526 A | 4/2010 |
| KR | 20070115261 A | 12/2007 |
| KR | 20090009387 A | 1/2009 |

OTHER PUBLICATIONS

Chinese Office Action Dated Nov. 15, 2014, Application No. 201310259706.5, 6 Pages.
Chinese Office Action for Chinese Patent Application No. CN201310260045.8, dated Nov. 24, 2014, 6 Pages.
PCT Written Opinion Of The International Searching Authority for PCT/CN2013/084057, dated Mach 27, 2014, 15 Pages.
Chinese Office Action for Chinese Patent Application No. 201310260936.3, dated Dec. 3, 2014, 7 Pages.
Chinese Office Action for Chinese Patent Application No. 201310260936.3, dated Feb. 28, 2015, 7 Pages.
Chinese Office Action for Chinese Patent Application No. 201310260936.3, dated Sep. 30, 2015, 5 Pages.
PCT Written Opinion of the International Searching Authority for PCT CN2013/O84055 dated Apr. 3, 2014, 15 Pages.
Chinese Office Action for Chinese Patent Application No. 201310271688.2, dated Nov. 3, 2014, 6 Pages.
PCT Written Opinion Of The International Searching Authority for PCT/CN2013/089701 dated Apr. 3, 2014, 13 Pages.

* cited by examiner

ACTIVE MATRIX ORGANIC LIGHT EMITTING DIODE PIXEL UNIT CIRCUIT AND DISPLAY PANEL

CROSS-REFERENCE TO RELATED APPLICATIONS

This application is the U.S. national phase of PCT Application No. PCT/CN2013/084919 filed on Oct. 9, 2013, which claims priority to Chinese Patent Application No. 201310259706.5 filed on Jun. 26, 2013, the disclosures of which are incorporated in their entirety by reference herein.

TECHNICAL FIELD

The present invention relates to the field of display, in particular to an active matrix organic light emitting diode pixel unit circuit and a display panel.

BACKGROUND

Touch Screen Panel (TSP) in Cell technique is to manufacture a TSP sensor and a driving circuit thereof on an array substrate by an array process. The TSP sensor is integrated with a liquid crystal cell of the panel of the Liquid Crystal Display (LCD) so that the product is light and thin and has versatile functionalities. Therefore, the reliability of the touch panel is effectively improved.

Figure 1A:
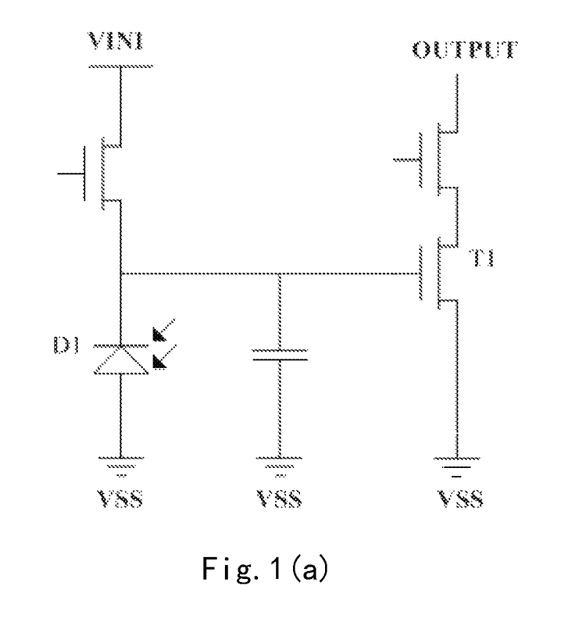
FIG. 1(a) and FIG. 1(b) are schematic diagrams showing touch screen circuits in the prior art.
Figure 1B:
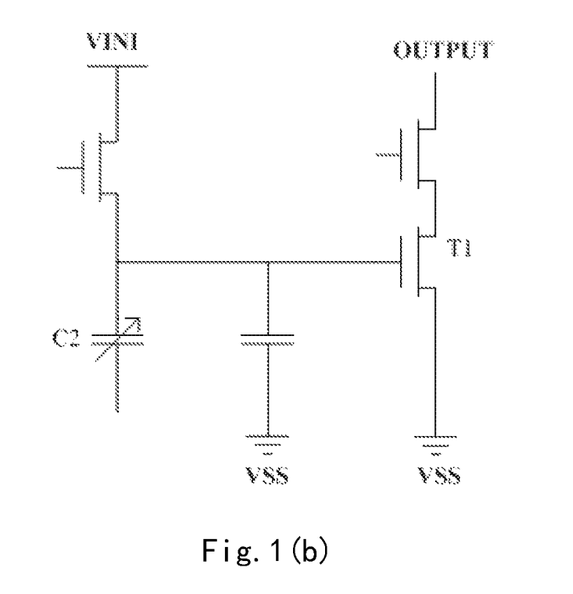

FIG. 1(a) and FIG. 1(b) show a basic light induced TSP in Cell circuit in the prior art. As shown in FIG. 1(a), the sensor senses light using a photodiode D1 and generates electric leakage to detect a touch signal. As shown in FIG. 1(b), the sensor senses light using a sensitive capacitor C2 and detects the touch signal by the coupling of the sensitive capacitor and the change of the capacitor. Thin-Film Transistor (TFT) T1 functions as an amplifying transistor to amplify the voltage change across D1 after detecting the touch signal, increase the driving capability of the TSP in Cell circuit output, so that an external readout circuit for TSP may correctly read out the detection result.

Figure 2:
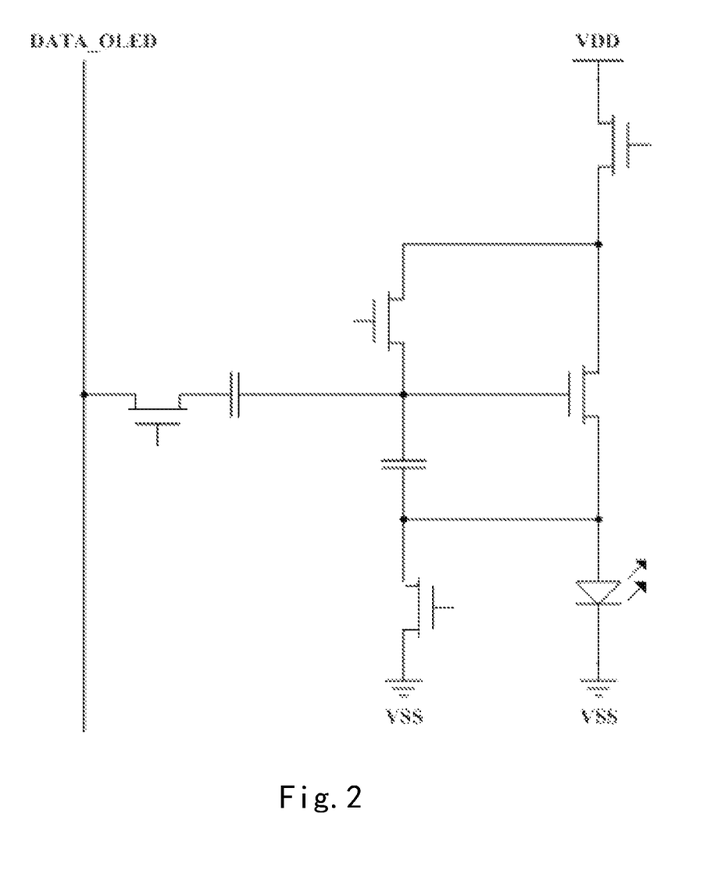
FIG. 2 is a schematic diagram showing an AMOLED pixel unit circuit in the prior art.

Active Matrix Organic Light Emitting Diode (AMOLED) has a faster response speed, a higher contrast ratio and a wider angle of view as compared with a traditional liquid crystal panel. AMOLED Pixels are driven to emit light by a relevant driving circuit on the array substrate. FIG. 2 shows an AMOLED pixel unit circuit according to an embodiment.

If the TSP in Cell circuit as shown in FIG. 1(a) or FIG. 1(b) is simply integrated into the AMOLED pixel unit circuit as shown in FIG. 2, except for the existing five TFTs and two capacitors, three TFTs and one capacitor are required to be added, and respect to the control signals, except for the existing three control signals and two power sources, three control signals are required to be added. However, there is not enough space in the AMOLED pixels for the addition of these TFTs and signal lines. Therefore, in the prior art, the TSP in Cell circuit cannot be integrated into the AMOLED pixel unit circuit.

SUMMARY

An embodiment of the present invention provides an active matrix organic light emitting diode pixel unit circuit and a display panel for integrating a touch screen circuit into the AMOLED pixel unit circuit and manufacturing a AMOLED display panel having the functionality of a touch screen.

An embodiment of the present invention provides an active matrix organic light emitting diode AMOLED pixel unit circuit, comprising a light emitting module, a driving module, a charging module, a threshold compensation module, a light emitting control module, a touch sensing module and a sensing signal output module, wherein the driving module is configured to amplify a sensing signal generated by the touch sensing module, output the sensing signal through the sensing signal output module, and drive the light emitting module;

the light emitting control module is configured to control the light emitting module to emit light;

the threshold compensation module is configured to compensate a threshold voltage of the driving module;

the charging module is configured to charge the threshold compensation module;

the touch sensing module is configured to generate the sensing signal and output the sensing signal to the driving module; and the sensing signal output module is configured to output the sensing signal amplified by the driving module.

An embodiment of the present invention provides a display panel, comprising the above AMOLED pixel unit circuit.

According to above technical solution, a few circuit components are added into the AMOLED pixel unit circuit according to an embodiment of the present invention, and the TSP in Cell circuit is integrated into the AMOLED pixel unit circuit using common data lines, circuit components and control signals and so on.

DETAILED DESCRIPTION

An embodiment of the present invention provides an active matrix organic light emitting diode pixel unit circuit and a display panel for integrating the touch panel circuit into the AMOLED pixel unit circuit and manufacturing the AMOLED display panel having the functionality of a touch screen.

Figure 3:
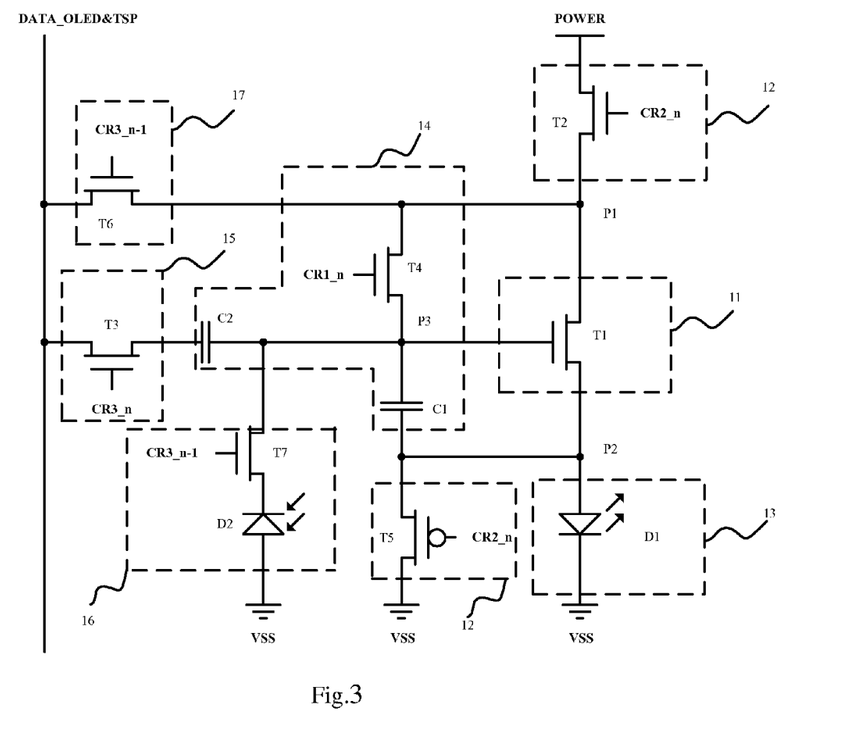
FIG. 3 is a schematic diagram showing an AMOLED pixel unit circuit according to an embodiment of the present invention.

As shown in FIG. 3, an embodiment of the present invention provides an active matrix organic light emitting diode pixel unit circuit, comprising a light emitting module 13, a driving module 11, a charging module 15, a threshold compensation module 14, a light emitting control module 12, a touch sensing module 16 and a sensing signal output module 17.

The driving module 11 is configured to amplify a sensing signal generated by the touch sensing module 16, output the sensing signal through the sensing signal output module 17, and drive the light emitting module 13.

The light emitting control module 12 is configured to control the light emitting module 13 to emit light.

The threshold compensation module 14 is configured to compensate a threshold voltage of the driving module 11.

The charging module 15 is configured to charge the threshold compensation module 14.

The touch sensing module 16 is configured to generate the sensing signal and output the sensing signal to the driving module 11.

The sensing signal output module 17 is configured to output the sensing signal amplified by the driving module 11.

Preferably, the driving module 11 comprises a first transistor T1, the gate electrode thereof is connected to the threshold compensation module 14 through a node P3, as shown in FIG. 3. The other two electrodes of the first transistor T1 are connected to a first node P1 and a second node P2 of the light emitting control module 12 respectively.

Preferably, the light emitting control module 12 comprises a second transistor T2 and a fifth transistor T5. Wherein, the gate electrode of the second transistor T2 is connected to a second signal control line of the AMOLED pixel unit circuit at the same stage (corresponding to the second control signal CR2_*n* of the AMOLED pixel unit circuit at the same stage), the other two electrodes of the second transistor T2 are connected to a power source line (corresponding to the power control signal POWER) and the first node P1, respectively. The gate electrode of the fifth transistor T5 is connected to the second signal control line of the AMOLED pixel unit circuit at the same stage, and the other two electrodes are connected to the second node P2 and a low voltage level VSS signal line, respectively.

Preferably, the light emitting module 13 comprises a light emitting diode D1, and one end thereof is connected to the second node P2 and the other end thereof is connected to the low voltage level signal line (corresponding to the low voltage level signal VSS).

Preferably, the threshold compensation module 14 comprises a fourth transistor T4, a first capacitor C1 and a second capacitor C2.

Wherein, the gate electrode of the fourth transistor T4 is connected to a first signal control line of the AMOLED pixel unit circuit at the same stage (corresponding to the first control signal CR1_*n* of the AMOLED pixel unit circuit at the same stage), the other two electrodes are connected to the first node P1 and the gate electrode of the first transistor T1, respectively. The first capacitor C1 is connected between the gate electrode of the first transistor T1 and the second node P2. The second capacitor C2 is connected between the charging module 15 and the gate electrode of the first transistor T1.

Preferably, the charging module 15 comprises a third transistor T3, the gate electrode thereof is connected to a third signal control line of the AMOLED pixel unit circuit at the same stage (corresponding to the fourth control signal CR3_*n*), the other two electrodes of the third transistor T3 are connected to a data line (corresponding to the data signal DATA_OLED&TSP) and the second capacitor C2 of the threshold compensation module 14, respectively.

Figure 4:
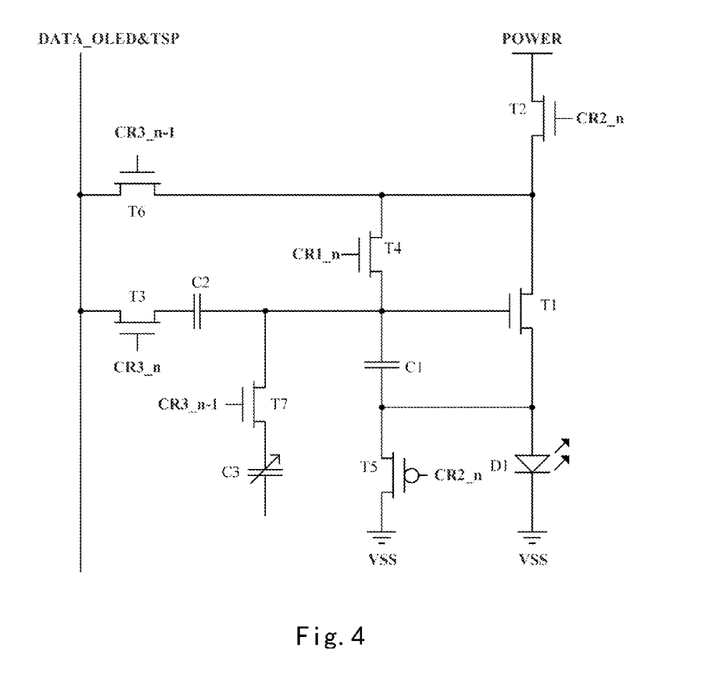
FIG. 4 is a schematic diagram showing an AMOLED pixel unit circuit according to another embodiment of the present invention.

Preferably, the touch sensing module 16 comprises a seventh transistor T7 and a photodiode D2. Wherein, the gate electrode of the seventh transistor T7 is connected to the third signal control line of the AMOLED pixel unit circuit at the previous stage (corresponding to the third control signal CR3_*n*−1 of the AMOLED pixel unit circuit at the previous stage), the other two electrodes of the seventh transistor T7 are connected to the photodiode D2 and the gate electrode of the first transistor T1. One end of the photodiode D2 is connected to the seventh transistor T7, and the other end of the photodiode D2 is connected to the low voltage level signal line. Or FIG. 4 is a schematic diagram showing an AMOLED pixel unit circuit according to another embodiment of the present invention. As shown in FIG. 4, the touch sensing module comprises the seventh transistor T7 and a sensing capacitor C3. Wherein, the gate electrode of the seventh transistor T7 is connected to the third signal control line of the AMOLED pixel unit circuit at the previous stage, the other two electrodes of the seventh transistor T7 are connected to the sensing capacitor C3 and the gate electrode of the first transistor T1, respectively. One end of the sensing capacitor C3 is connected to the seventh transistor T7, and the other end needs to contact with external environment, for example, a human body, so as to change the voltage of the first capacitor C1 based on the coupling of the sensing capacitor and the change of the capacitor.

Referring back to FIG. 3, preferably, the sensing signal output module 17 comprises a sixth transistor T6, the gate electrode thereof is connected to the third signal control line of the AMOLED pixel unit circuit at the previous stage, and the other two electrodes of the sixth transistor are connected to the date line and the first node P1, respectively.

Preferably, the anode of the photodiode D2 is connected to the low voltage level signal line, and the cathode is connected to the seventh transistor T7.

Preferably, the anode of the light emitting diode D1 is connected to the second node P2, and the cathode is connected to the low voltage level signal line.

Preferably, the first transistor T1, the second transistor T2, the third transistor T3, the fourth transistor T4, the sixth transistor T6 and the seventh transistor T7 are all N type thin film transistors TFTs, the fifth transistor T5 is a P type TFT.

After the touch sensing module 16 generates the sensing signal, the sensing signal is amplified and output by the first transistor T1. At this time, the sixth transistor T6 is on, the current outputted from the first transistor T1 is transmitted to the data line, a signal generated by touching is read out through the data line.

When the seventh transistor T7 is on, sensing component D2 or C3 is capable of generating the sensing signal and the sensing signal is inputted into the first transistor T1.

The touch sensing module 16 also uses the capacitor C1 as a storage capacitor and also uses the power line. The power line alternatively inputs required levels for the TSP in cell circuit and the AMOLED circuit.

According to an embodiment of the present invention, the low voltage level signal VSS is a cut-off level and the value of the cut-off level is maintained constant.

The difference between the structure shown in FIG. 4 and the structure shown in FIG. 3 is that if the sensing component is a sensing capacitor, one end of the sensing capacitor is connected to the seventh transistor, and the other end of the sensing capacitor needs to be connected to the external environment such as a human body, and the voltage of the first capacitor is changed according to the coupling of the sensing capacitor and the change of the capacitor. There are no differences among other connections.

The specific operating principle of the circuit according to an embodiment of the present invention will be described in detail with reference to FIG. 3, FIG. 5 and FIG. 6.

Figure 5:
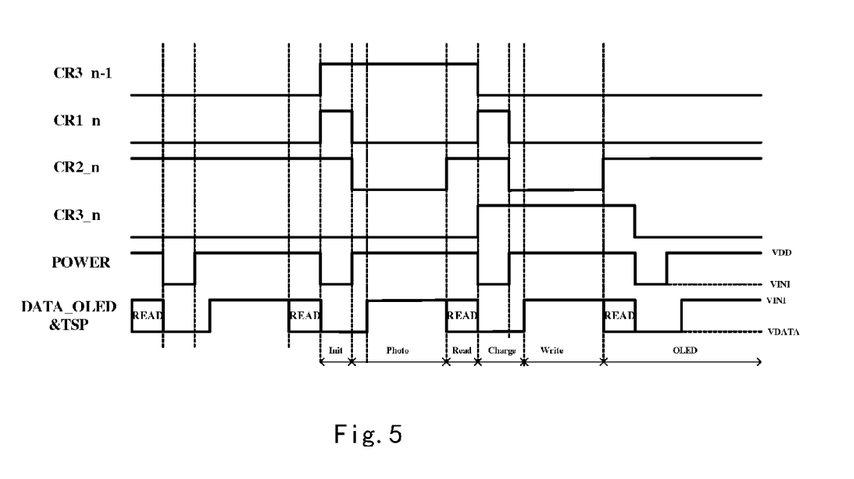
FIG. 5 is a time sequence diagram of a control signal of the AMOLED pixel unit circuit according to an embodiment of the present invention.
Figure 6:
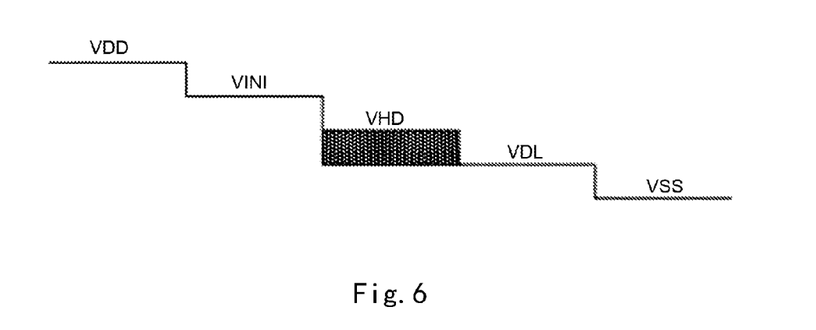
FIG. 6 is a diagram showing the level size relationship among the control signals of the AMOLED pixel unit circuit according to an embodiment of the present invention.

FIG. 5 shows the time sequences of the operating signals according to an embodiment of the present invention. The circuit according to an embodiment of the present invention works in six operating phases, which are an Init phase (an initial phase), a sensing Photo phase, a Read phase, a Charge phase, a Write phase and an organic light emitting diode OLED phase. As shown in FIG. 5, VDATA is a grayscale voltage of the data line DATA_OLED&TSP, the range of the grayscale voltage is [VDL, VDH], and the brightness of D1 is different under different grayscale voltages. Each phase will be described as below. FIG. 6 shows the size relationship among the signal levels shown in FIG. 5. The size of the level is shown in the vertical direction, the level is bigger when the height is higher and the level is smaller when the height is lower. As shown in FIG. 6, VSS<VDL<VDH<VINI<VDD, these values of the levels are preset, and the specific level may be set according to actual requirements.

Init Phase: T7 is on, the photodiode D2 functioned as the TSP sensor is connected to the gate electrode of T1 which functioned as an amplifying TFT, C1 is the storage capacitor for the amplifying TFT T1. T2 and T4 are on, the level of POWER is VINI. TSP is initialized, that is the storage capacitor C1 connected to the gate electrode of T1 is pre-charged to the initialized level VIM so that T1 operates in a saturated and amplified states during the subsequent phases.

Photo Phase: T2 and T4 are off, and T7 is on. The photodiode D2 detects the touch status of a panel. When the panel is touched by a finger, an external light source cannot illuminate the photodiode D2, D2 receives fewer light and its light induced leakage current is small, thereby the change of the voltage level of C1 caused by electric leakage is smaller during the Photo Phase. When the panel is not touched by a finger, the external light source can illuminate the photodiode D2, D2 receives more light and generates larger light induced leakage current, thereby the change of the voltage level of C1 caused by electric leakage is larger during the Photo Phase. Therefore, if the panel is touched, the difference between the voltage of the gate electrode of T1 and the initial voltage is small, and if the panel is not touched, the difference between the voltage of the gate electrode of T1 and the initial voltage is large.

Read Phase: the level generated during Photo Phase is stored in C1. At this time, T6 is on, and T3 and T4 are off. DATA_OLED&TSP functions as a readout line for TSP output result. The voltage of the gate electrode of T1 is amplified through the first node P1 and T6, and is outputted to the readout line, which is also outputted to an external TSP readout circuit.

TSP in Cell is working in the above three phases, the touch from outside maybe sensed and the sensing signal is outputted. After the work phases of TSP in Cell are finished, the circuit proceeds into the work phases of the AMOLED circuit.

Charge Phase: T6 and T7 are off. Firstly, POWER is at the voltage $V_{INI}$ which is slightly smaller than VDD. T2 and T4 are on, the voltage of C1 is $V_{INI}$. Secondly, POWER is at VDD, T2 and T4 are off, C1 is discharged to voltage $V_{TH}$ which is the threshold voltage of T1.

Write Phase: T3 is on. The grayscale voltage $V_{DATA}$ is inputted into the data line during the Charge Phase previously, and then the voltage $V_{INI}$ is inputted into the data line during the Write Phase. Therefore, the voltage of C1 (i.e. the voltage of the gate electrode of T1) becomes $$V_{TH} + (V_{INI} - V_{DATA}) \cdot \frac{C_2}{C_1 + C_2}.$$

OLED Phase: T2 is on, and T3 and T5 are off. T1 works and D1 emits light. The current $I_{T1}$ outputted by T1 is $$I_{T1} = k \cdot \left[ V_{TH} + (V_{INI} - V_{DATA}) \cdot \frac{C_2}{C_1 + C_2} - V_{TH} \right]^2 =$$
$$k \cdot \left[ (V_{INI} - V_{DATA}) \cdot \frac{C_2}{C_1 + C_2} \right]^2$$

wherein k is a preset constant, and the range of $V_{DATA}$ is from VDL to VDH.

An embodiment of the present invention further provides a display panel, comprising the AMOLED pixel unit circuit mentioned above.

In summary, according to an embodiment of the present invention, the time sequences and the levels of the operating signals are redesigned, a few circuit components are added into the existing AMOLED pixel unit circuit, and the TSP in Cell circuit is integrated into the AMOLED pixel unit circuit using a common data line, common circuit components and common control signals and so on.

It is obvious that a person skilled in the art may make further improvements and modifications without departing from the spirit and scope of the present invention, and the present application intends to cover all of the improvements and modifications if they fall into the claims of the present application and the equivalents thereof.

What is claimed is:

1. An active matrix organic light emitting diode AMOLED pixel unit circuit, comprising a light emitting circuit, a charging circuit, a threshold compensation circuit, a driving circuit, a light emitting control circuit, a touch sensing circuit and a sensing signal output circuit, wherein,
the driving circuit comprises a first transistor, the gate electrode thereof is connected to a third node of the AMOLED pixel unit circuit, the other two electrodes of the first transistor are connected to a first node and a second node of the AMOLED pixel unit circuit respectively, wherein the third node is a connection point which connects the driving circuit and the threshold compensation circuit, the first node is a connection point which connects the driving circuit and the light emitting control circuit, and the second node is a common connection point which connects the driving circuit, the light emitting control circuit and the light emitting circuit;
the driving circuit is configured to amplify a sensing signal generated by the touch sensing circuit, output the sensing signal through the sensing signal output circuit, and drive the light emitting circuit;
the light emitting control circuit is configured to control the light emitting circuit to emit light;
the threshold compensation circuit is configured to compensate a threshold voltage of the driving circuit;
the charging circuit is configured to charge the threshold compensation circuit;
the touch sensing circuit is configured to generate the sensing signal and output the sensing signal to the driving circuit; and
the sensing signal output circuit is configured to output the sensing signal amplified by the driving circuit.

2. The AMOLED pixel unit circuit according to claim 1, wherein, the first transistor, a second transistor, a third transistor, a fourth transistor, the sixth transistor and the seventh transistor are all N type thin film transistors TFTs, the fifth transistor is a P type TFT.

3. A display panel, comprising the active matrix organic light emitting diode AMOLED pixel unit circuit according to claim 1.

4. The AMOLED pixel unit circuit according to claim 1, wherein the sensing signal output circuit is configured to output via a data line the sensing signal amplified by the driving circuit, and the driving circuit is configured to receive a signal via the data line so as to drive the light emitting circuit.

5. The AMOLED pixel unit circuit according to claim 1, wherein, the light emitting control circuit comprises a second transistor and a fifth transistor, wherein, a gate electrode of the second transistor is connected to a second signal control line of the AMOLED pixel unit circuit at a stage, the other two electrodes of the second transistor are connected to a power source line and the first node respectively; a gate electrode of the fifth transistor is connected to the second signal control line of the AMOLED pixel unit circuit at the stage, and the other two electrodes of the fifth transistor are connected to the second node and a low voltage level signal line respectively.

6. The AMOLED pixel unit circuit according to claim 5, wherein, the light emitting circuit comprises a light emitting diode, and one end of the light emitting diode is connected to the second node and the other end of the light emitting diode is connected to the low voltage level signal line.

7. The AMOLED pixel unit circuit according to claim 6, wherein, an anode of the light emitting diode is connected to the second node and the cathode of the light emitting diode is connected to the low voltage level signal line.

8. The AMOLED pixel unit circuit according to claim 6, wherein, the threshold compensation circuit comprises a fourth transistor, a first capacitor and a second capacitor;
wherein, a gate electrode of the fourth transistor is connected to a first signal control line of the AMOLED pixel unit circuit at the stage, the other two electrodes of the fourth transistor are connected to the first node and the gate electrode of the first transistor respectively, the first capacitor is connected between the gate electrode of the first transistor and the second node, the second capacitor is connected between the charging circuit and the gate electrode of the first transistor.

9. The AMOLED pixel unit circuit according to claim 8, wherein, the charging circuit comprises a third transistor, the gate electrode of the third transistor is connected to a third signal control line of the AMOLED pixel unit circuit at the stage, the other two electrodes of the third transistor are connected to a data line and the second capacitor of the threshold compensation circuit respectively.

10. The AMOLED pixel unit circuit according to claim 9, wherein, the touch sensing circuit comprises a seventh transistor and a photodiode, wherein, a gate electrode of the seventh transistor is connected to a third signal control line of the AMOLED pixel unit circuit at a previous stage, the other two electrodes of the seventh transistor are connected to the photodiode and the gate electrode of the first transistor, one end of the photodiode is connected to the seventh transistor, and the other end of the photodiode is connected to the low voltage level signal line.

11. The AMOLED pixel unit circuit according to claim 10, the sensing signal output circuit comprises a sixth transistor, a gate electrode of the sixth transistor is connected to the third signal control line of the AMOLED pixel unit circuit at the previous stage, and the other two electrodes of the sixth transistor are connected to the date line and the first node respectively.

12. The AMOLED pixel unit circuit according to claim 10, wherein, an anode of the photodiode is connected to the low voltage level signal line, and a cathode of the photodiode is connected to the seventh transistor.

13. The AMOLED pixel unit circuit according to claim 9, wherein, the touch sensing circuit comprises a seventh transistor and a sensing capacitor, wherein, a gate electrode of the seventh transistor is connected to a third signal control line of the AMOLED pixel unit circuit at a previous stage, the other two electrodes of the seventh transistor are connected to the sensing capacitor and the gate electrode of the first transistor respectively.

14. The AMOLED pixel unit circuit according to claim 13, the sensing signal output circuit comprises a sixth transistor, a gate electrode of the sixth transistor is connected to the third signal control line of the AMOLED pixel unit circuit at the previous stage, and the other two electrodes of the sixth transistor are connected to the date line and the first node respectively.

* * * * *